United States Patent [19]
Haddad et al.

[11] Patent Number: 5,617,357
[45] Date of Patent: Apr. 1, 1997

[54] FLASH EEPROM MEMORY WITH IMPROVED DISCHARGE SPEED USING SUBSTRATE BIAS AND METHOD THEREFOR

[75] Inventors: Sameer S. Haddad, San Jose; Hao Fang, Cupertino, both of Calif.

[73] Assignee: Advanced Micro Devices, Inc., Sunnyvale, Calif.

[21] Appl. No.: 420,989

[22] Filed: Apr. 7, 1995

[51] Int. Cl.⁶ .................................................. G11C 11/40
[52] U.S. Cl. .............................. 365/185.27; 365/185.18; 365/185.33
[58] Field of Search ................... 365/185.27, 185.18, 365/185.29, 185.26, 185.33, 185.1, 185.11

[56] References Cited

U.S. PATENT DOCUMENTS 4,698,787 10/1987 Mukherjee et al. .................... 365/185
5,077,691 12/1991 Haddad ............................. 365/185.23
5,295,095 4/1994 Josephson ......................... 365/185.27
5,357,463 10/1994 Kinney ............................. 365/185.26

OTHER PUBLICATIONS

Koyabashi et al., "Memory Array Architecture and Decoding Scheme for 3 V Only Secotr Erasable DINOR Flash Memory", IEEE Journal of Solid State Circuits, vol. 29, No. 4, Apr. 1994.

Primary Examiner—A. Zarabian
Attorney, Agent, or Firm—James H. Phillips; Michael A. Lechter

[57] ABSTRACT

A floating gate cell memory device, such as an EPROM or flash EEPROM, with improved discharge speed. A negative bias is applied to the effective substrate during discharge. The negative bias increases the electric field near the junction, thereby increasing the number of hot holes which can be injected to the floating gate, improving discharge speed.

28 Claims, 11 Drawing Sheets

FLASH EEPROM MEMORY WITH IMPROVED DISCHARGE SPEED USING SUBSTRATE BIAS AND METHOD THEREFOR

BACKGROUND OF THE INVENTION

1. Field of the Invention

The invention relates generally to programmable memory devices, and more particularly, to floating gate memory devices such as flash electrically erasable programmable read only memory (EEPROM) devices.

2. Description of the Related Art

Computer systems and other modern electronic equipment typically store information in electronic memory devices, each of which typically comprises an array of individual cells. One such memory device is a flash electrically erasable programmable read only memory (EEPROM). The structure and operation of an exemplary flash EEPROM device is described in U.S. Pat. No. 4,698,787, to Mukherjee et al., issued Oct. 6, 1987.

More specifically, referring to FIGS. 1 and 2, a conventional bulk silicon flash EEPROM device 100 typically includes an N×M array 104 of individual memory cells 110. Each cell 110, as shown in FIG. 1, typically includes: a double-diffused n-type source 112 and an n-type drain 114 formed in a p-type substrate 116; a channel 118 disposed in substrate 116 between source 112 and drain 114; and a selectively chargeable gate structure 160. Gate structure 160 suitably comprises: a floating gate 122 overlying channel 118 and overlapping the edges of drain 114 and source 112; a first layer of dielectric material, known as the tunnel dielectric 120, separating floating gate 122 from source 112, drain 114, and channel 118; a control gate 126 overlying floating gate 122; and a second layer of dielectric, known as the interpoly dielectric 124, separating floating gate 122 from control gate 126. The portion of source 112 (or drain 114) immediately underlying floating gate 122 is referred to as a tunneling region 140.

Array 104 (FIG. 2) typically includes a large number of cells 110, e.g. 1,000 or more, arranged in a series of rows and columns. Each row is driven by an associated word line (WL), comprising a conductive polysilicon layer that incorporates the control gate 126 of each cell 110 within the row. Each column is driven by an associated bit line (BL) comprising an overlying layer of metal connected to each drain 114 of the cells 110 within the column. Source 112 of each cell 110 within array 104 is coupled to a common source line CS formed by a conductive path diffused in substrate 116. Any individual cell 110 within array 104 can be individually addressed (i.e. charged and read) by operating upon one word line and one bit line.

Tunnel dielectric 120 suitably comprises a thin (e.g. approximately 100 angstroms) layer of oxide. Tunnel dielectric 120 may be formed on substrate 116 by any suitable technique, such as, for example, thermally oxidizing the surface of substrate 116 or by depositing a suitable material on substrate 116.

Floating gate 122 suitably comprises a conductive polysilicon such as polycrystalline silicon. Floating gate layer 122 may be formed by any suitable technique, such as, for example, by conventional chemical vapor deposition (CVD).

Interpoly dielectric layer 124 insulates control gate 126 from floating gate 122. Interpoly dielectric 124 suitably comprises a dielectric material, such as, e.g., an oxide-nitrate-oxide (ONO) layer, and may be formed by any suitable technique. For example, where interpoly dielectric 124 is ONO, it is suitably formed by growing a layer of oxide, depositing a layer of nitrate, followed by growing another layer of oxide.

Control gate 126, like floating gate 122, suitably comprises a layer of conductive polysilicon and may be formed on interpoly dielectric layer 124 by any suitable technique, such as, for example, by conventional chemical vapor deposition (CVD).

Control gate layer 126, interpoly dielectric layer 124, floating gate layer 122, and tunnel dielectric 120 are suitably masked and etched according to conventional methods to define the selectively chargeable stacked gate structures 160 of the respective cells.

Source 112 is typically formed by initially implanting a first n-type dopant, suitably phosphorous, to form a deeply diffused but lightly doped N well 130, establishing a graded source-channel junction. This first n-type implant is typically driven deeper into substrate 116 by subjecting substrate 116 to a thermal cycle at high temperature (e.g. 1050 degrees Fahrenheit. A shallow second n-type implant is then performed (e.g., with arsenic) to create a more heavily doped, but shallower, N +well 132 embedded within deep N well 130. This second n-type implant also forms a shallow, abrupt drain to channel junction.

EEPROM 100 suitably includes a control circuit 125 to selectively connect the source, gate and drain of an addressed cell to predetermined voltages or impedances to effect one of the operational states of the cell. Control circuit 125 is suitably connected to source 122 of each cell 110 through common source line CS; through a word line (WL) to the control gate 126 of each cell 110 in the corresponding row; and through a bit line (BL) to the drains 124 of each cell 110 in the corresponding column. The voltages presented by control circuit 125 determine the operational state of cells 110.

The various operating states of cell 110 include a charge state, a read state, and a discharge state. The voltages and impedances coupled to source 112, drain 114, and control gate 126 by control circuit 125 during each of these states depends on whether or not cell 110 is in the selected row (corresponding to word line WL) and column (corresponding to bit line BL). The connections for the various operating states of cell 110 are summarized in Table I.

TABLE I

| Operation | $V_S$ (CS) | $V_G$ (WL) Selected | $V_G$ (WL) Unselected | $V_D$ (BL) Selected | $V_D$ (BL) Unselected |
|---|---|---|---|---|---|
| Charge | 0 | +9 to +12 | 0 | +5 to +7 | 0 |
| Read | 0 | +5 | 0 | +1 to +2 | 0 |
| Discharge | +12 | 0 | | High-Z (Floating) | |

The charging and discharging of floating gate 122 in prior art cell 110 typically corresponds to programming and erasing the cell, respectively. During charging, a specific memory cell 110 in a specific row and column is charged by applying the appropriate charge voltage to the selected row and column while inhibiting the charging of unselected memory cells of array 104. For example, referring again to FIG. 1, floating gate 122 of an individual cell 110 is charged through high energy electron injection, often referred to as hot electron injection. By applying the appropriate potentials to source 112, drain 114, and control gate 126, as shown in Table I, hot electrons 136A are injected from channel 118 through tunnel dielectric 120 to negatively charge floating gate 122. Charging floating gate 122 with a negative potential raises the threshold voltage of cell 110 by a predetermined amount $\Delta V_T$ from a first nominal value $V_{T1}$ to a second nominal value $V_{T2}$. As a result, a charged cell ($V_T>V_{T2}$) conducts substantially less current during a subsequent read operation than an uncharged (or discharged) cell ($V_T<V_{T1}$) (i.e. having no charge on floating gate 122 ).

During a read operation, a predetermined voltage $V_g$ is applied to control gate 126 of selected cell 110. If the selected cell 110 is not charged ($V_T<V_{T1}$), the gate voltage $V_g$ typically exceeds the threshold voltage V of the cell, and cell 110 conducts a relatively high current (above a predetermined upper threshold level, e.g. 100 microamps). Conduction of such high level current is indicative of a first state, e.g., a zero or logical low. On the other hand, if the selected cell 110 is charged ($V_T>V_{T2}$), the gate voltage $V_G$ is typically less than the threshold voltage $V_{T2}$ of the cell, and the cell is non-conductive, or at least conducts less current (below a predetermined lower threshold level, e.g. 20 microamps). Conduction of such low level current is indicative of a second state, e.g., a one or logical high.

In contrast to the charging procedure, flash EEPROMs are typically bulk-discharged, so that all of cells 110 in array 104 (i.e. connected to common source line CS) are simultaneously discharged. Appropriate potentials (Table I) applied to the source 112, drain 114, and control gate 126 during the discharge state cause electron migration from floating gate 122 to source 112 or drain 114 via Fowler-Nordheim (F-N) tunneling. For example, electrons 136B stored during charging on floating gate 122 migrate through tunnel dielectric 120 to source 112 in tunneling region 140. F-N tunneling occurs simultaneously for all cells 110 within memory array 104 during the discharge state, thereby discharging entire array 104 in one "flash" or operation.

Operation of flash EEPROMs similar to that shown in FIGS. 1 and 2 from a single power supply is also known. An example is disclosed in U.S. Pat. No. 5,077,691, to Haddad et al., issued Dec. 31, 1991. Instead of providing a relatively high voltage to the source to effect discharge, a lower voltage, such as the typical power supply voltage (e.g. +5 volts), is applied to the source in conjunction with a relatively high magnitude negative voltage to the control gate. Since little current flows through the control gate, the gate voltage can be generated using on-board charge pumps. Thus, the need for a second, higher voltage (e.g. +12 volts) power supply to effect discharge is eliminated.

The array of cells employed in single supply flash EEPROMs is similar to that described in conjunction with FIGS. 1 and 2. However, in contradistinction to the earlier flash EEPROM, the charge, read and discharge operations are effected by establishing the connections to the selected and unselected cells as summarized in Table II.

TABLE II

| Operation | $V_S$ (CS) | $V_G$ (WL) Selected | $V_G$ (WL) Unselected | $V_D$ (BL) Selected | $V_D$ (BL) Unselected |
|---|---|---|---|---|---|
| Charge | 0 | +9 to +12 | 0 | +5 to +7 | 0 |
| Read | 0 | +5 | 0 | +1 to +2 | 0 |
| Discharge | +.5 to +5 | −13 to −7 | | High-Z (Floating) | |

In general, the control circuit for the single supply flash EEPROM provides the same voltages in the charge state and read state as in the multi-supply flash EEPROM 100 of FIGS. 1 and 2. Substrate 116 is grounded ($V_{SUB}=0$ volts) at all times. However, in the single supply EEPROM, discharge of floating gate 122 is effected by applying a negative voltage, preferably a relatively high magnitude negative voltage (e.g., −13 volts to −7 volts), to control gate 126. Source 112 is suitably coupled to a relatively low positive voltage, typically varied in the positive range just above zero to $V_{cc}$, preferably, +0.5 volts to +5.0 volts, and more preferably in the range +2.0 volts to +5.0 volts. Power supply voltage $V_{cc}$ is typically +5.0 volts. Drain 114 typically floats (High-Z). Source current may be relatively high, for example 20 to 30 milliamps for array 104, but is supplied at a voltage level less than or equal to the power supply voltage (e.g., $V_{cc}=+5$ volts). Control gate current is suitably relatively small, e.g., 1 nanoamp or less per cell. As a result, the negative voltage on control gate 126 may be generated with a charge pump circuit integrated into the flash EEPROM.

While the source of the single supply EEPROM cells may be double-diffused (i.e. with deep well 130 and shallow well 132) as shown in FIG. 1, the lower source-to-substrate voltage during discharge for the cell permits the source to be single-diffused (i.e. no deep well 130) rather than double-diffused. Use of a single diffused source eliminates the initial diffusion step and subsequent thermal drive employed to create deep well 130, simplifying the process for fabricating the flash EEPROM. Further, while the values in Table I and the tunneling region 140 of FIG. 1 correspond to discharging floating gate 122 from the source, the source and drain connections during discharge could be switched, if desired, to effect discharge at the drain. This is particularly true when a single diffused source is employed.

Another type of known flash EEPROM employs a DIvided bit-line NOR (DINOR) architecture, which utilizes bulk charging and selective discharging of cells (as opposed to the selective charging and bulk discharging discussed above with reference to cells 110). The DINOR architecture is described in Koyabashi et al., "Memory Array Architecture and Decoding Scheme for 3 V Only Sector Erasable DINOR Flash Memory", IEEE Journal of Solid State Circuits, vol. 29, no. 4, Apr. 1994.

Briefly, however, referring to FIGS. 3 and 4, a DINOR flash EEPROM 500 typically comprises an array 504 of individual cells 510 and a control circuit 525. Each cell 510 typically comprises: single-diffused n-type source 5 12, p-type channel 518 and single-diffused n-type drain 514 regions formed in a P-well 550; and a selectively chargeable stacked gate structure 160 overlying channel 518 and a portion of source 512 and drain 514. DINOR flash EEPROM 500 is typically formed on a p-type substrate 516, with P-well 550 isolated from substrate 516 by a deep N-well 552. Deep N-well 552 suitably provides electrical isolation between array 504 and associated peripheral circuitry (not shown). Deep N-well 552 is typically grounded (FIG. 3), while P-well 550 is typically selectively connected to an external voltage source $V_{SUB}$.

The cells 510 of array 504 are effectively grouped (i.e., array 504 is effectively divided) into a predetermined number of equal-sized sectors, each associated with a separate source line CS (and source driver circuitry). More specifically, the source of each cell in an individual sector is connected in common (typically formed as part of a common semiconductor region), but isolated from the sources of the cells of the other sectors. Each sector is, in turn, typically divided into respective upper and lower memory units, e.g. an upper bank 507 and lower bank 509 of cells 510. Each bank 507 and 509 is arranged in M rows (e.g. 8) and N columns (e.g. 512) for a total size of each sector within EEPROM 500 of N×M bits (e.g. 8K bits, or 1K byte).

Array 504 includes respective word lines (WL) and (main) bit lines (BL), generally corresponding to the word lines and bit lines of array 104 (FIGS. 1 and 2). However, each word line (WL) is associated with (e.g., incorporates the control gates of) a respective row of cells in each of upper memory bank 507 and lower memory bank 509. Likewise, each bit line is divided into respective alternative sub-bit lines SB-U and SB-L associated with corresponding columns of cells in upper memory unit 507 and lower memory unit 509, respectively. Bit line BL is selectively coupled to one or the other sub-bit lines SB-U and SB-L by a respective select transistor 511 and 5 13, suitably alternatively actuated by an upper select gate signal (USG) and an inverted lower select gate signal (LSG).

As previously noted, array 104 employs bulk discharge of cells 110, and selective charging of individual cells to effect the desired states (e.g. program the array). In contradistinction, DINOR array 504 employs bulk charging of cells, and selective discharge of cells to effect the desired cell states.

Charging of cells 510 within array 504 is typically effected in a different manner than cells 110. As discussed above, cells 110 are typically charged using hot electron injection, and bulk discharged via F-N tunneling. In DINOR array 504, both charging and discharging of cells 510 is typically performed via F-N tunneling. While charging by hot electron injection is substantially faster than charging via F-N tunneling, since the charging of cells 510 is done in bulk (all cells within a sector are charged concurrently), the consequence of the longer charging time of the F-N tunneling cycle is ameliorated.

Control circuit 525 may be any circuit suitable for selectively effecting connections to source (CS), control gate (WL), drain (BL) and P-well 550, to effect desired operations. Exemplary connections (conditions) for the various operating states of DINOR cells 510 are summarized in Table III.

500 becomes excessive. Therefore, there existed a need to improve the discharge time of prior art flash EEPROM devices, both for cells in a the standard flash EEPROM configuration, and in a DINOR arrangement.

SUMMARY OF THE INVENTION

The present invention provides a floating gate memory device, such as an EPROM or flash EEPROM, with a faster discharge time than comparable conventional devices. A negative voltage is applied to the substrate to enhance discharge time, limited primarily by breakdown of the source-substrate junction. The negative bias on the substrate may be selected by balancing discharge speed with the rate of hot hole injection to optimize the discharge speed and performance of the device.

BRIEF DESCRIPTION OF THE DRAWING

The preferred exemplary embodiment of the present invention is described in conjunction with the appended drawings, where like designations denote like elements, and.

TABLE III

| Operation | $V_S$ (CS) | $V_G$ (WL) Selected | $V_G$ (WL) Unselected | $V_D$ (BL) Selected | $V_D$ (BL) Unselected | $V_{SUB}$ |
|---|---|---|---|---|---|---|
| Charge | −8 | +10 | 0 | High-Z (Floating) | | −8 |
| Read | 0 | +5 | 0 | +1 to +2 | 0 | 0 |
| Discharge | High-Z (Floating) | −8 | 0 | +5 | 0 | 0 |

Figure 3:
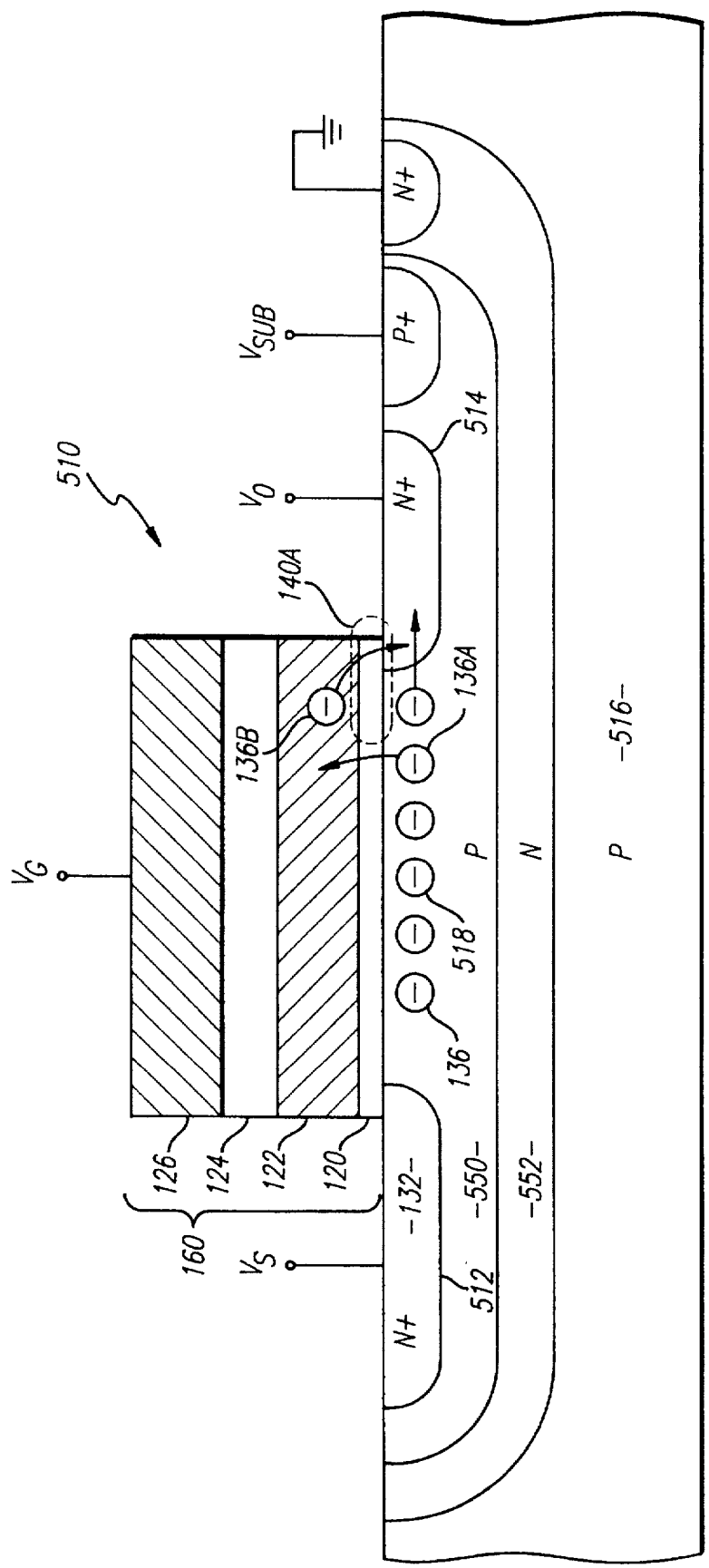
FIG. 3 is a cross-sectional view of a floating gate cell used in a DINOR architecture.
Figure 5:
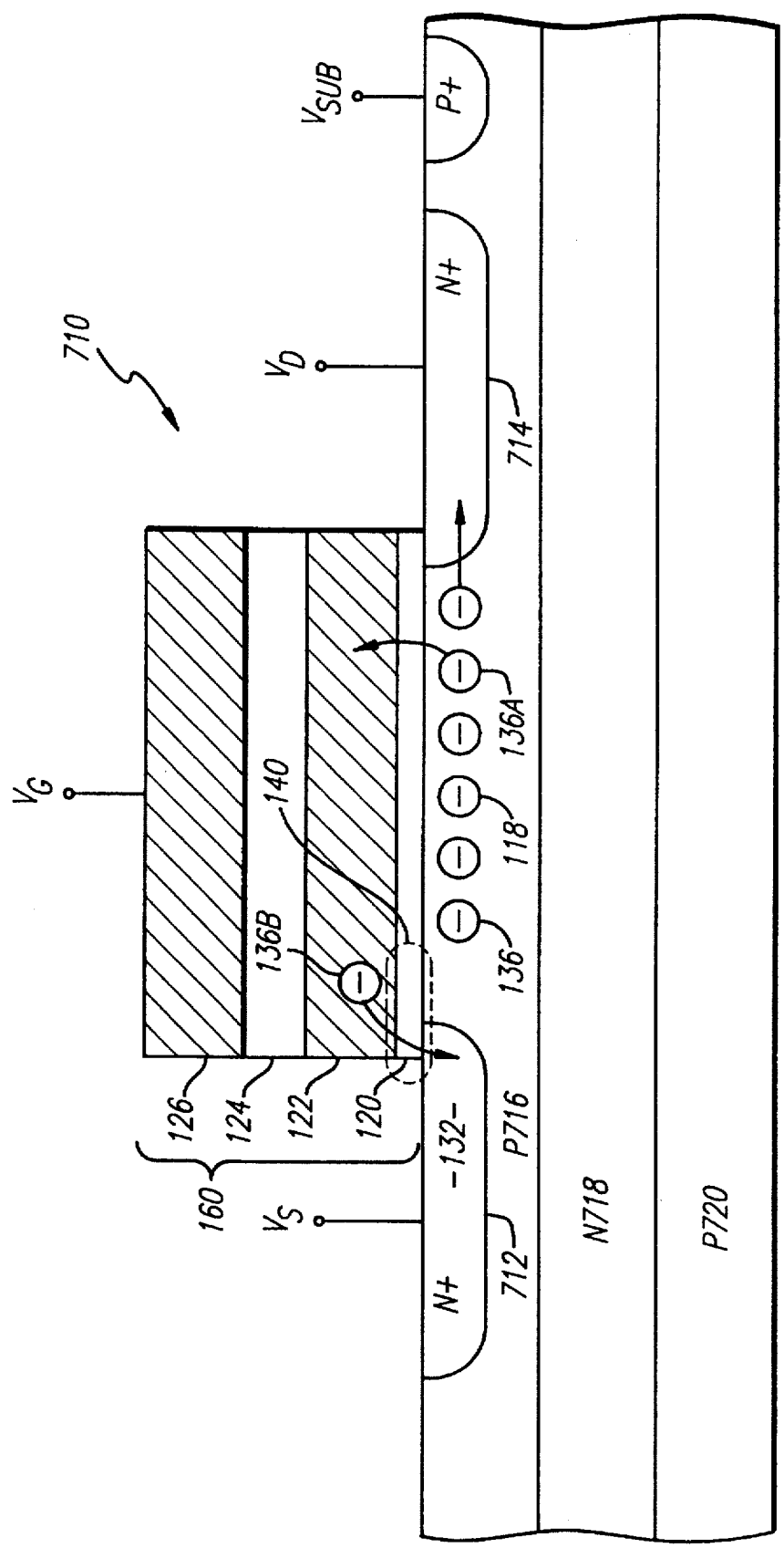
FIG. 5 is a cross-sectional view of an floating gate cell according to various aspects of the present invention with the discharging of the cell occurring at the source with a negative voltage bias applied to the effective substrate for the cell.
Figure 7:
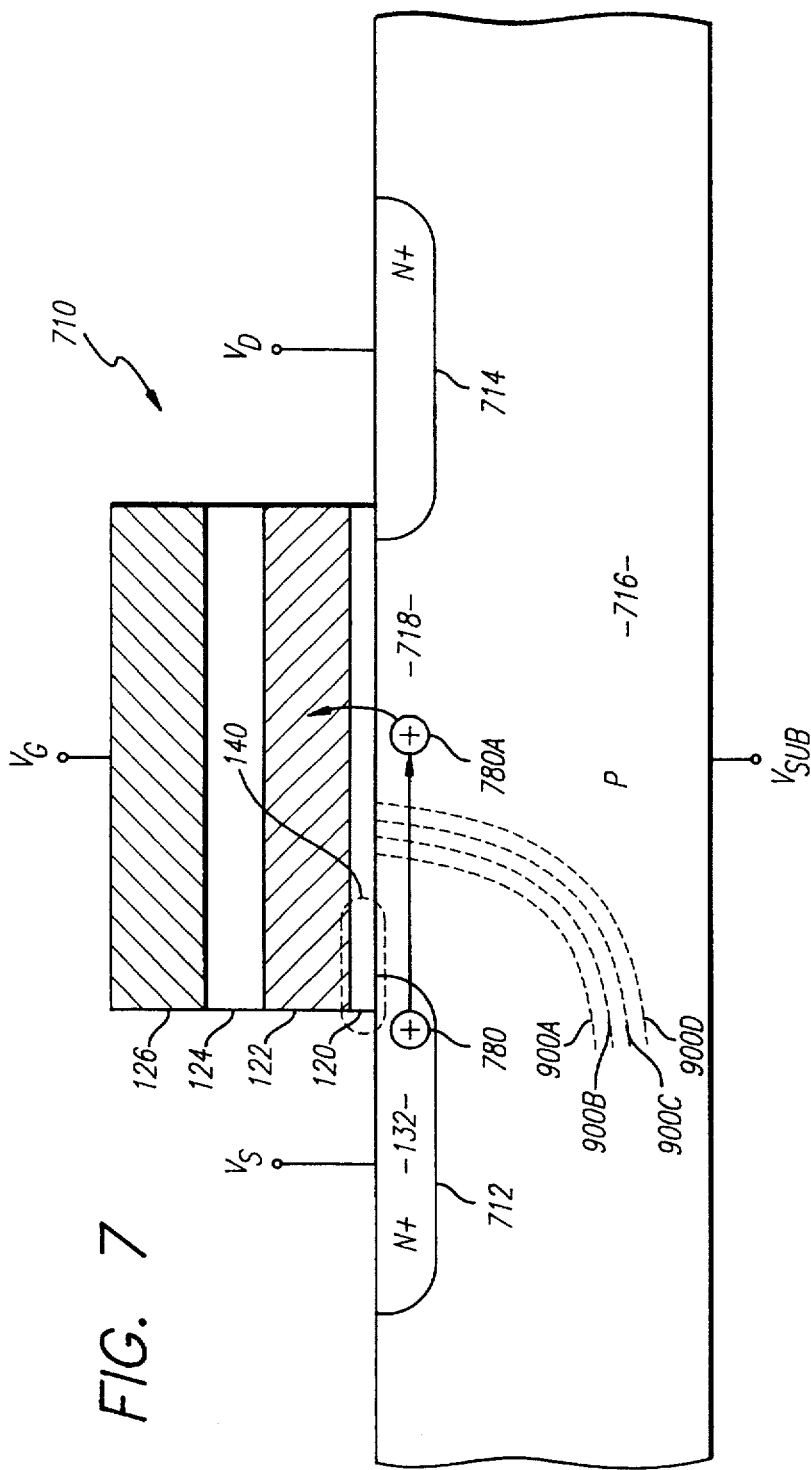
Figure 7A:
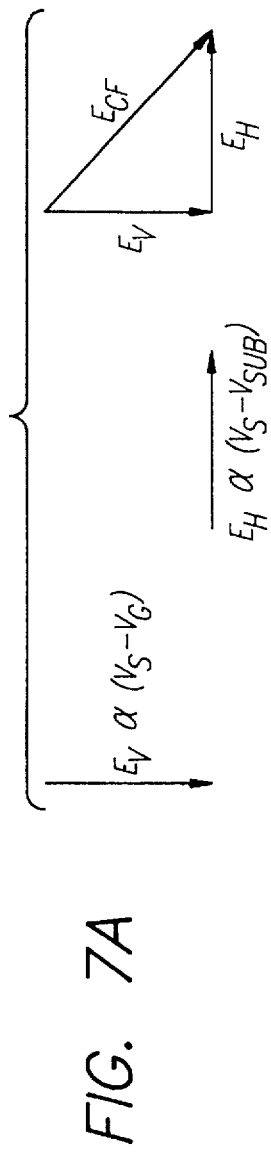
Figure 8:
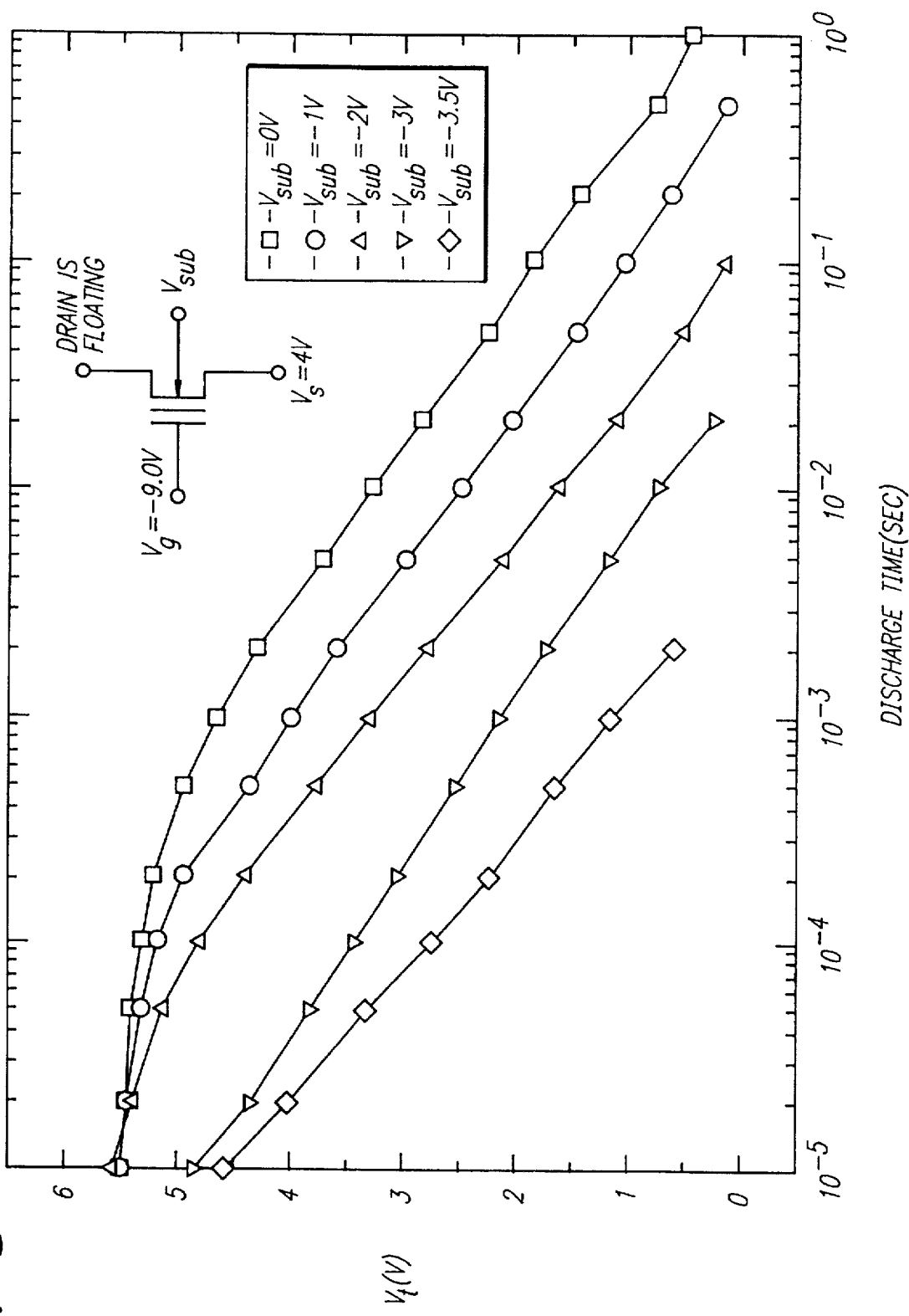
Figure 9:
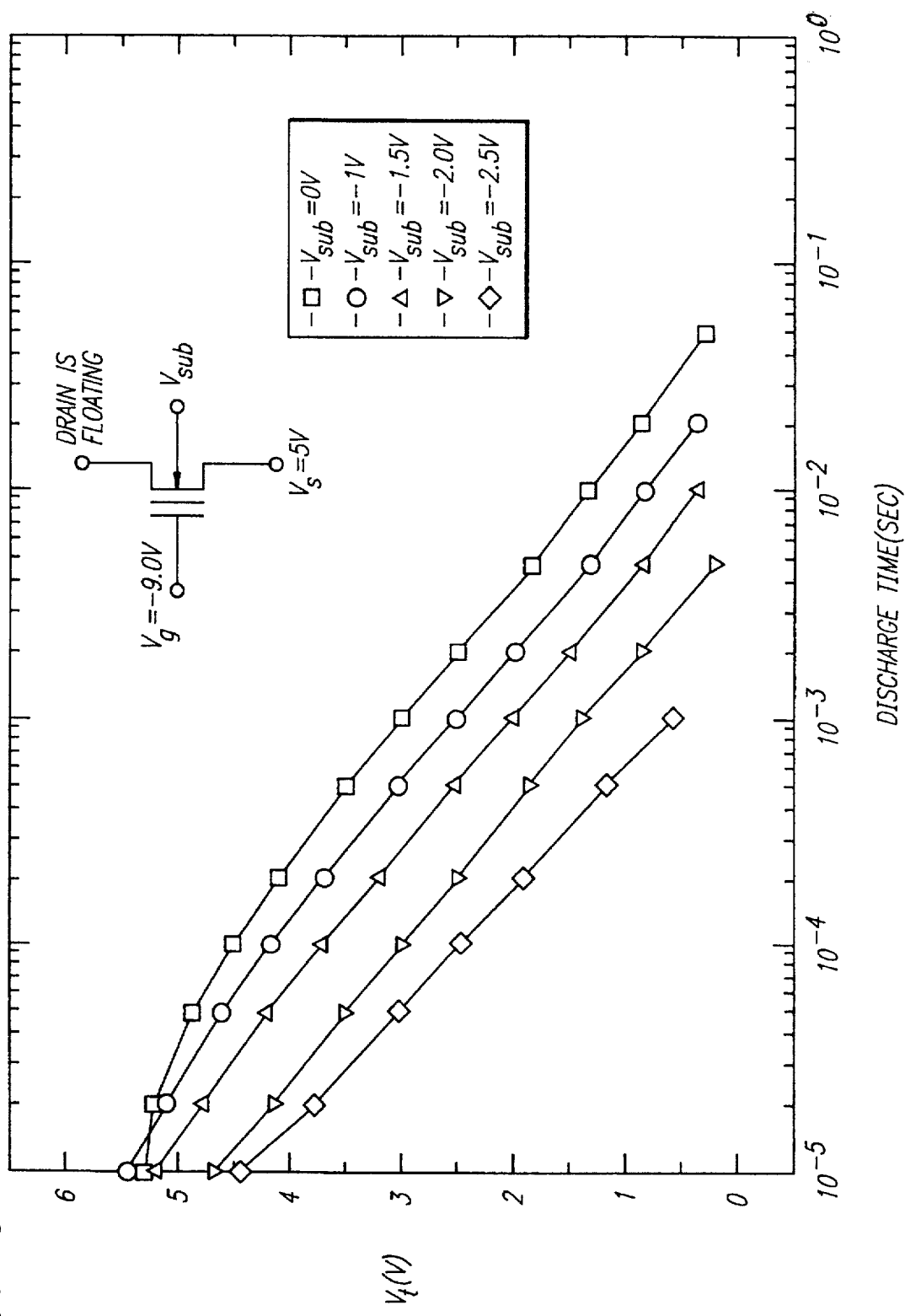
Figure 10:
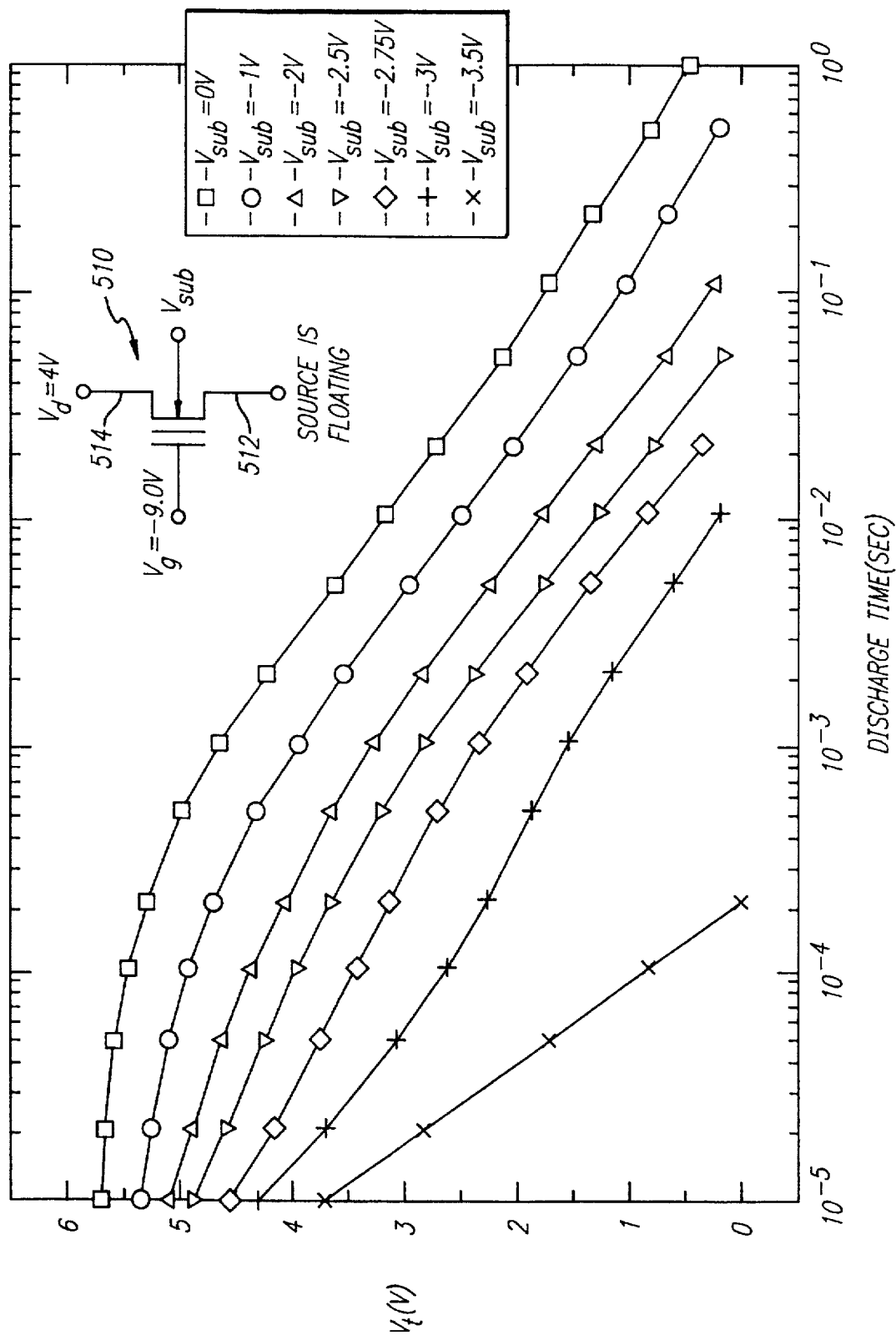
Figure 11:
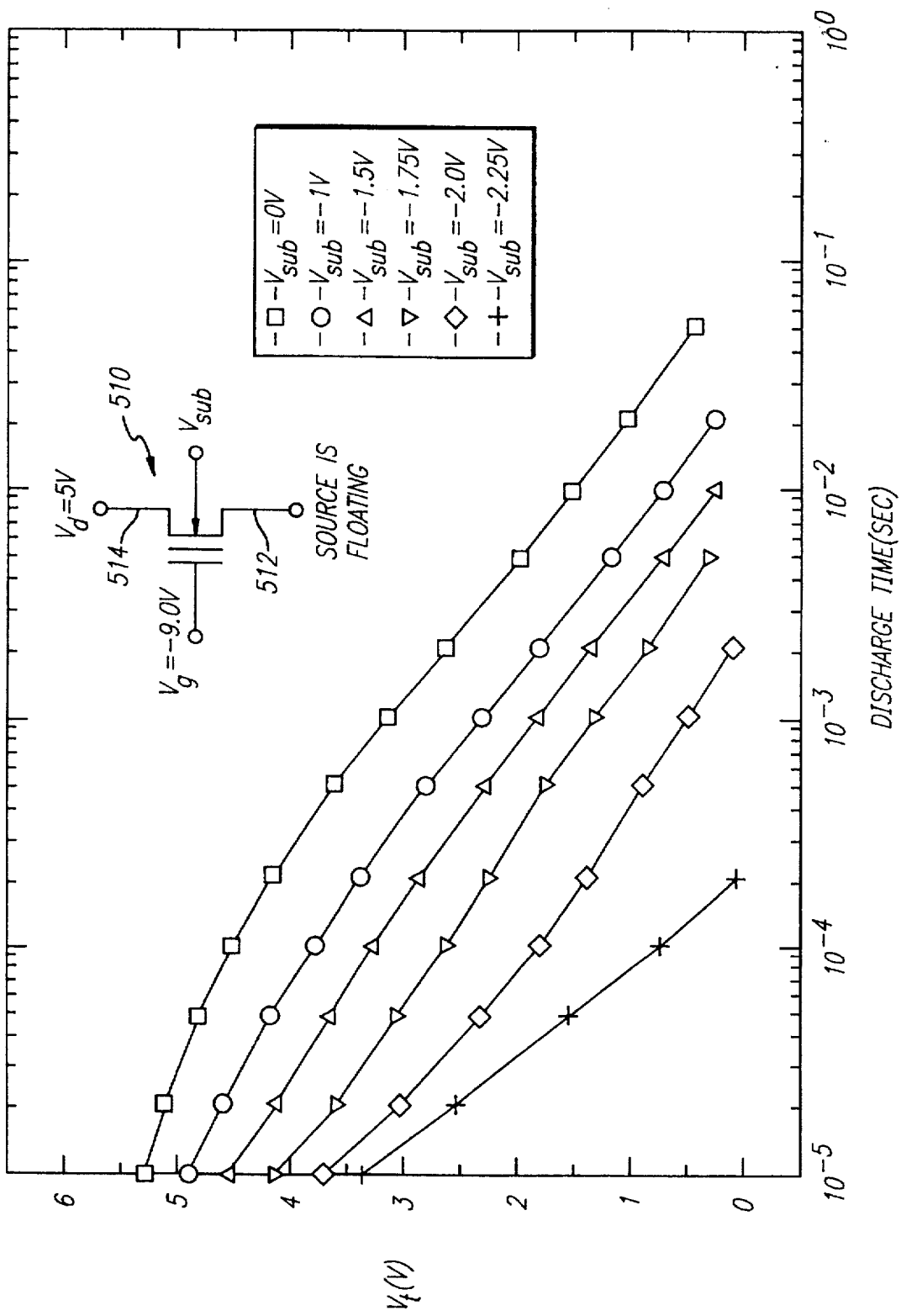

In general, selective discharge of all of the bits in a given row is effected concurrently. Thus, the time required to discharge a cell is somewhat less critical than would be the case if the cells were discharged in seriatim; the effective discharge time is the time per cell for the F-N tunneling cycle divided by the number of cells in the row. For example, assuming that each word line has 512 bits, if the F-N cycle takes 100 milliseconds to perform, the effective write time per cell is 100 milliseconds/512, or approximately 200 microseconds per cell, which is comparable to the speed of individually programming (i.e. charging) cells 110 via hot electron injection. Each row, however, must be sequentially programmed. Thus, as the number of rows and sectors in EEPROM 500 increases, the amount of total time to discharge (program) the DINOR flash EEPROM device FIG. 7 is a cross sectional view of the floating gate cell of FIG. 5 showing the effect of a negative effective substrate bias $V_{SUB}$ on the depletion region of the source;

FIG. 7A is a representation of the electric fields present in the channel region of the floating gate cell of FIG. 7;

FIG. 8 is a composite graph of the discharge time of the floating gate cell of Figure 5 for discharge from the source as a function of effective substrate bias $V_{SUB}$ when $V_s$=+4 volts;

FIG. 9 is a composite graph of the discharge time of the floating gate cell of FIG. 5 for discharge from the source as a function of effective substrate bias $V_{SUB}$ when $V_s$=+5 volts;

FIG. 10 is a composite graph of the discharge time of the floating gate cell of FIG. 3 in accordance with the present invention for discharge from the drain as a function of effective substrate bias $V_{SUB}$ when $V_D=+4$ volts; and FIG. 11 is a composite graph of the discharge time of the floating gate cell of FIG. 3 in accordance with the present invention for discharge from the drain as a function of effective substrate bias $V_{SUB}$ when $V_D=+5$ volts.

DETAILED DESCRIPTION OF A PREFERRED EXEMPLARY EMBODIMENT

Figure 1:
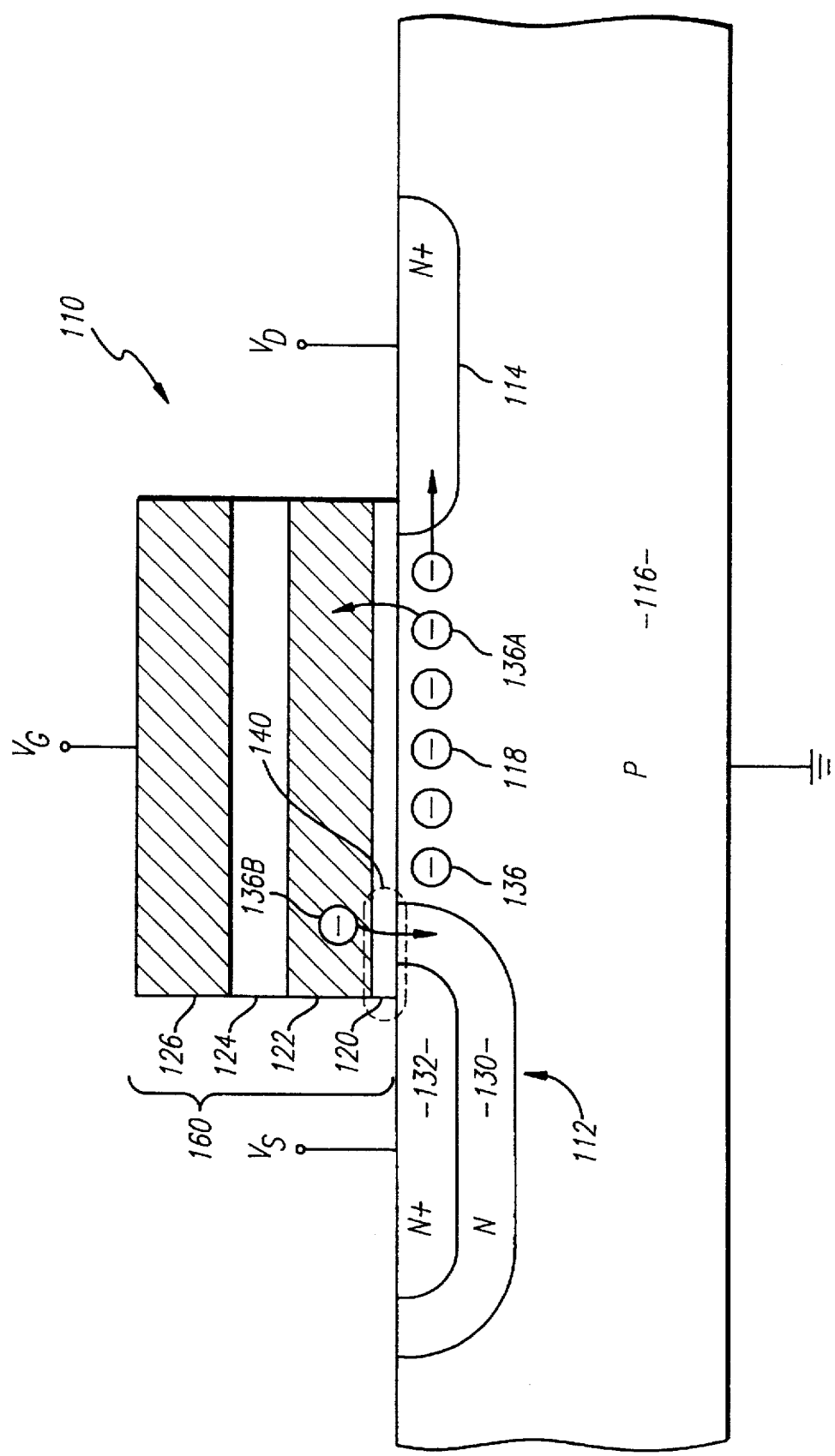
FIG. 1 is a cross-sectional view of a conventional floating gate cell.
Figure 2:
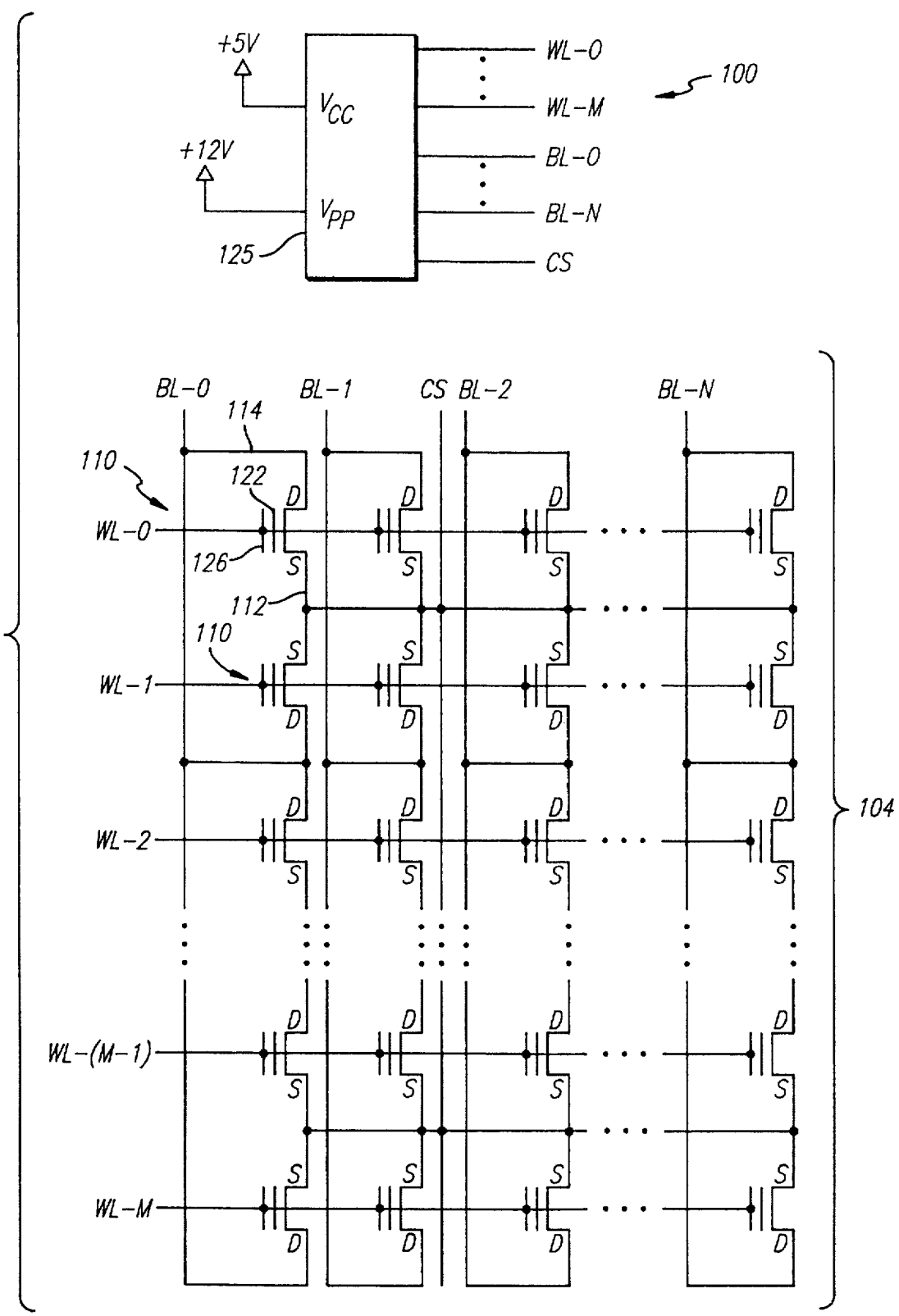
FIG. 2 is a schematic diagram of a control circuit and arrangement of the cells of FIG. 1 within a conventional array.
Figure 6:
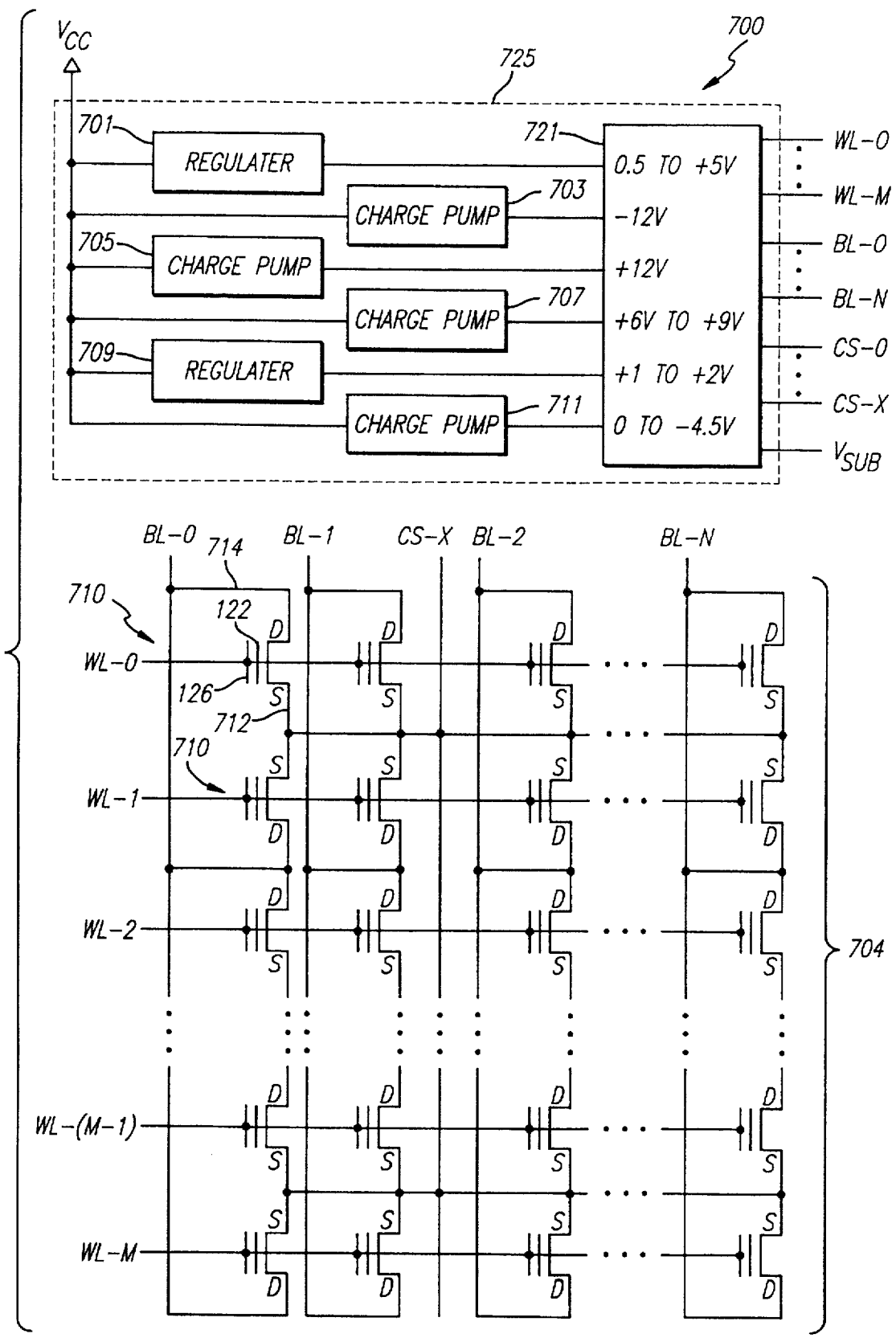
FIG. 6 is a schematic diagram that illustrates a control circuit and the arrangement of the cells of FIG. 5 within an array.

Referring now to FIGS. 5 and 6, a floating gate memory device 700, such as an EPROM or flash EEPROM, in accordance with a first embodiment of the present invention suitably includes an N×M array 704 of individual memory cells 710 and a control circuit 725 (FIG. 6) formed on a common substrate 720. Array 704 is suitably formed in an encompassing P-well 716 isolated from substrate 720 by a deep N-well 718. P-well 716, in effect, acts as a local substrate for array 704, with deep N-well 718 providing electrical isolation between array 704 and control circuit 725. Each cell 710 suitably comprises source 712 and drain 714 semiconductor regions and a selectively chargeable gate structure 160. Gate structure 160 suitably comprises: floating gate 122; thin gate dielectric layer 120; control gate 126; and interpoly dielectric layer 124. Cell 710 (FIGS. 5 and 6) may be identical in structure to cell 110 (FIG. 1), or may have a different structure optimized for discharge operations as discussed in more detail below. For example, source 712 of cell 710 is suitably only single-diffused, i.e. with only an abrupt N +well 132. Thin gate dielectric layer 120 is formed of a suitable dielectric material (e.g., silicon dioxide) of predetermined thickness, e.g., within the range of: from 50 to 200 angstroms; and preferably 50 to 150 angstroms: more preferably, from 70 to 150 angstroms; and most preferably from 80 to 120 angstroms.

Array 704 suitably includes a large number, e.g. 1,000 or more, of cells 710 arranged in M rows and N columns, with each row driven by a word line (WL), and each column driven by a bit line (BL). As with cell 110, word line WL suitably comprises a conductive polysilicon layer that forms control gate 126 of each cell 710 within a given row, and bit line BL suitably comprises an overlying layer of metal connected to drain region 714 of each underlying cell 710 within a given column.

Control circuit 725 may be any circuit capable of selectively connecting source 712, control gate 126, and drain 714 of each cell and P-well 716 to predetermined voltages or impedances to effect one of the operational states of one particular selected cell 710. Control circuit 725 suitably includes respective regulators 701 and 709, respective charge pumps 703, 705, 707, and 711, and a suitable decoder/switching circuit 721. Control circuit 725, like the prior art control circuit 125 for EEPROM 100, is suitably connected to source 712 of each cell 710 through common source line CS (or a source line CS-0 - CS-X common to each cell in a sector); through a respective word line (WL) to the control gate 126 of each cell 710 in the corresponding row; and through a bit line (BL) to drain 714 of each cell 710 in the corresponding column. However, control circuit 725 also selectively applies a predetermined negative voltage to P-well 716 during discharge operations. The voltages presented by control circuit 725 determine the operational state of cell 710. Exemplary values are summarized in Table IV below.

TABLE IV

| Operation | $V_S$ | $V_G$ (WL) | | $V_D$ (BL) | | $V_{SUB}$ |
|---|---|---|---|---|---|---|
| | | Selected | Unselected | Selected | Unselected | |
| Charge | 0 | +8 to +12 | 0 | +5 to +7 | 0 | 0 |
| Read | 0 | +5 | 0 | +1 to +2 | 0 | 0 |
| Discharge | +0.5 to +5 | −13 to −7 | | High-Z (Floating) | | −0.01 to −4.5 |

The various voltages employed (e.g., +8, +6, −12, $V_{SUB}$) are suitably derived from the external voltage source $V_{cc}$ by on-chip charge pumps 703, 705, 707, and 711. Use of charge pumps to generate the required voltages on-chip is made feasible by the low magnitude currents required by source 712, drain 714, and control gate 126 during the respective operational states of memory device 700. The source current for Memory device 700 during the discharge state is suitably drawn from the $V_{CC}$ supply, or from on-chip regulator 701 connected to $V_{cc}$. Therefore, an external +12 volt supply (as for EEPROM 100) is not needed for discharge operations. Similarly, the current requirement of control gate 126 is very small, e.g. 1 nanoamp per cell. Accordingly, the −13 to −7 (e.g., −12) volts applied on control gate 126 during discharge operation, and the +8 to +12 volts (e.g. 9 volts) applied on control gate 126 during charge operations can be provided by charge pumps 703 and 705. Likewise, the current required by drain 714 is small enough to allow charge pump 707 to supply the required voltage and current during charging operations, while on-chip regulator 709 supplies the required voltage and current to drain 714 during read operations. If desired, regulator 709 could be omitted and regulator 701 could supply the same voltage to both source 712 during the discharge state and to drain 714 during the read state. In addition, charge pump 711 suitably supplies a negative voltage $V_{SUB}$ for selective application to P-well 716. The various voltages from the charge pumps and regulators are selectively coupled to the various word lines (WL), bit lines (BL), common source lines (CS), and substrate ($V_{SUB}$) by decoder/switch circuit 721. Control circuit 725 thus generates and supplies all the required voltages to effect all operating states of cell 710.

In accordance with one aspect of the invention, the discharge time of flash Memory device 700 is decreased by negatively biasing P-well 716 (the effective substrate for array 704) with a predetermined voltage $V_{SUB}$ when cells 710 are being discharged. The negative biasing voltage may be provided by any suitable source, preferably derived by on-chip charge pump 711 from external supply $V_{CC}$. Placing a negative voltage on P-well 716 (with source, drain and control gate connected for discharging) increases the rate of discharge for cell 710 by increasing the number of hot holes available for injection through gate dielectric layer 120 to floating gate 122. The added hot holes remove the negative charge on floating gate 122 more rapidly. Referring to FIG. 7, negative voltage $V_{SUB}$ on P-well 716 tends to widen the source depletion region in cell 710 by extending the depletion region boundary 900. When $V_{SUB}$=0 volts (e.g. in the prior art configuration of FIG. 1 ), the source depletion region is defined by a boundary 900A (FIG. 7). Applying a bias of $V_{SUB}$ of −1 volt to P-well 716, on the other hand, widens the depletion region, i.e. the depletion region boundary moves from line 900A to line 900B. Increasing the magnitude of the negative substrate bias widens the depletion region still further: $V_{SUB}$=−2 volts moves the depletion region boundary to line 900C, and $V_{SUB}$=−3 volts moves the depletion region boundary to line 900D. Thus, the greater the magnitude of $V_{SUB}$, the wider the depletion region of source 112.

The widened depletion region tends to increase the band-to-band tunneling current due to the increased electrical field in channel 718. Referring to FIG. 7A, the electrical field in channel 718 is proportional to: 1) the vertical field $E_v$ (which is, in turn, proportional to the source to floating gate voltage $(V_S-V_G)$), and 2) the horizontal field $E_H$ (which is, in turn proportional to the source to substrate voltage $(V_S-V_{SUB})$). The resultant field in channel 718 is known as a "corner field" $E_{CF}$, which is the vector sum of the vertical field $E_V$ and the horizontal field $E_H$.

Applying a negative bias to P-well 716 during discharge increases band-to-band tunneling current, which, in turn, produces a higher rate of hole generation in channel 718 due to impact ionization. Band-to-band tunneling current from source 712 to P-well 716 tends to be a function of the corner field $E_{CF}$ in channel 718, whereas F-N gate current tends to be a function of the vertical field $E_V$. As $V_{SUB}$ is increased to greater magnitude negative voltages, horizontal field $E_H$ increases, thereby increasing the magnitude of corner field $E_{CF}$. This, in turn, increases the rate of hot hole generation due to impact ionization. This, in turn, tends to increase the band-to-band tunneling current. Ultimately, the magnitude of the negative voltage $V_{SUB}$ on P-well 716 reaches a level (break down limit) at which the band-to-band tunneling current causes the source/substrate junction to break down, creating excessive avalanche current.

However, the wider source depletion region caused by $V_{SUB}$ at magnitudes below the break down limit results in a faster discharge time for cells 710. Holes 780 generated in source 712 tend to accelerate across the depletion region between source 712 and the boundary of the depletion region, represented by appropriate line 900A–D (FIG. 7). The widened depletion region and stronger horizontal field $E_H$ causes greater acceleration of holes across the depletion region so that more holes 780 are likely to acquire sufficient energy (i.e. become sufficiently "hot") to be injected through dielectric 120 to floating gate 122. The hot holes 780A that are injected through gate dielectric layer 120 to floating gate 122 neutralize or discharge the negative charge stored on floating gate 122 during a charge operation. The additional hot holes 780A caused by $V_{SUB}$ thus increase the discharge speed of cell 710, so $V_{SUB}$ can provide what is properly termed "hole-assisted discharge."

The discharge time is affected by the difference between the voltage at the region where discharge is effected, e.g. the source, and the negative substrate bias $V_{SUB}$. For example, as illustrated in FIGS. 8 and 9, with all else equal, a larger difference in voltage will effect a faster discharge. For example, referring to FIG. 8, discharge of cell 710 may be effected at the source by placing −9 volts on control gate 126, 4 volts on source 712, and by floating drain 714. With these biasing conditions, the time necessary to discharge cell 710 decreases as the magnitude of $V_{SUB}$ increases. Exemplary values are illustrated in FIG. 8 and summarized in Table V below.

TABLE V

| $V_G$ = −9 volts; $V_S$ = 4 volts; $V_D$ = floating | |
|---|---|
| $V_{SUB}$ (volts) | Discharge Speed ($V_T$ = 0) |
| 0 | 2 sec |
| −1 | 700 ms |
| −2 | 150 ms |
| −3 | 30 ms |
| −3.5 | 5 ms |

However, for the same value $V_{SUB}$, the discharge time can be decreased still further by increasing the voltage on the discharge region, e.g. source. For example, referring to FIG. 9, discharge of cell 710 is effected at the source by again placing −9 volts on control gate 126, and by floating drain 714, but increasing the voltage $V_S$ on source 712 to 5 volts. With these biasing conditions, the time necessary to discharge cell 710 likewise decreases as the magnitude of $V_{SUB}$ increases. However, the discharge time for a given $V_{SUB}$ value is less than for that $V_{SUB}$ value with $V_S$=4 volts. Exemplary values are illustrated in FIG. 9 and summarized in Table VI below.

TABLE VI

| $V_G$ = −9 volts; $V_S$ = 5 Volts; $V_D$ = floating | |
|---|---|
| $V_{SUB}$ (volts) | Discharge Speed ($V_T$ = 0) |
| 0 | 80 ms |
| −1 | 35 ms |
| −1.5 | 20 ms |
| −2.0 | 6 ms |
| −2.5 | 2 ms |

Increasing the discharge speed by using a negative substrate bias to enhance hot hole injection during the discharge state may, however, cause some undesirable side effects. For example, some of hot holes 780A may become trapped in gate dielectric layer 120. As previously discussed, trapped holes may degrade the performance of Memory device 700 because of a tendency to migrate to floating gate 122 and neutralize the stored negative charge of a charged cell 710. In addition, an excess number of hot holes 780A injected through gate dielectric layer 120 may cause physical degradation of tunnel dielectric 120, reducing the number of charge/discharge cycles (i.e. endurance) each cell 710 within Memory device 700 can withstand.

The value $V_{SUB}$ may be varied in the negative range just below zero to any negative voltage that provides the desired discharge speed/performance characteristics. The optimal voltage for $V_{SUB}$ to maximize discharge speed without significantly degrading performance over time may vary according to the physical characteristics of cell 710 (e.g. scale, doping, depth of diffused regions, etc.). Improved performance may be achieved by cell configurations designed to enhance speed and minimize degradation. The corner field $E_{CF}$ of cell 710 may be optimized by junction engineering to achieve desired discharge speed and endurance characteristics for a predetermined level or range of $V_{SUB}$. For example, the size, doping level and doping profile of source region 712, drain region 714, and channel 718, and thickness and material of tunnel dielectric 120, may be optimized to increase endurance according to particular levels of negative substrate bias $V_{SUB}$. Additionally, a hot carrier resistant thin oxide, such as nitrided oxide, may be used for tunnel dielectric 120 to increase endurance.

The presence of the negative P-well (effective substrate) bias voltage $V_{SUB}$ causes increased hot hole injection to floating gate 122 during discharge operations, which in turn causes a desirable shorter discharge time, but at the expense of an undesirable decrease in the endurance of Memory device 700. The judicious selection of an appropriate substrate bias voltage $V_{SUB}$ will therefore balance the discharge speed against the avalanche source current effect to achieve acceptable operational characteristics, i.e. , a desired tradeoff between discharge speed and endurance.

Figure 4:
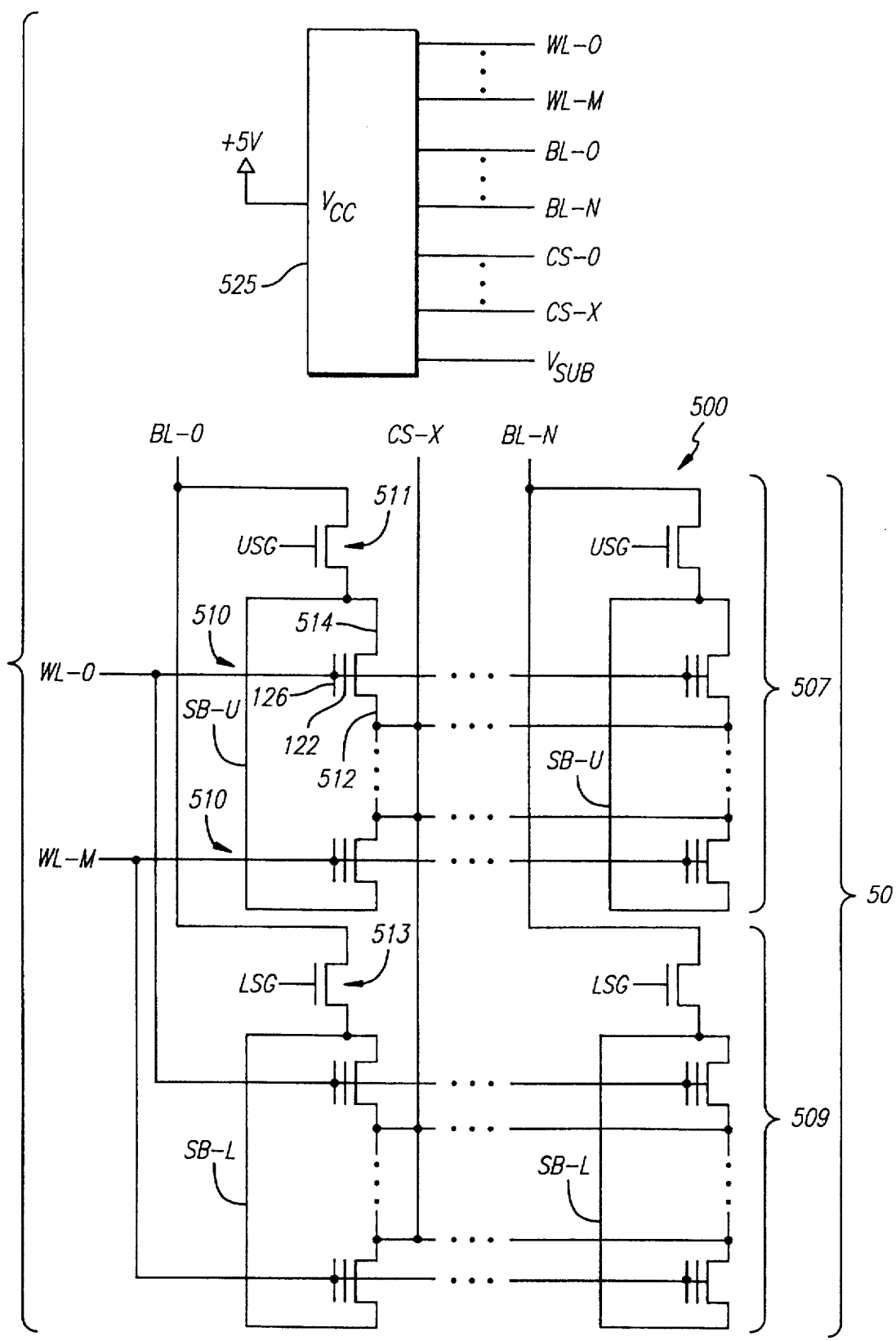
FIG. 4 is a schematic diagram illustrating the arrangement of the cells of FIG. 3 within an DINOR array.

Negative biasing during discharge operations to decrease discharge time, in accordance with the present invention, can also be employed in DINOR cell arrays. If desired, cells 510 may have a structure optimized for discharge operations. Referring again to FIGS. 3 and 4, as previously noted, control circuit 525 (FIG. 4) selectively connects source 512, control gate 126, drain 514, of each cell within the array and P-well 550 to predetermined voltages or impedances to effect one of the operational states of one particular selected cell. Exemplary voltages presented by control circuit 525 to cells 510 to effect operation in accordance with the present invention, are summarized in Table VII below.

TABLE VII

| Operation | $V_S$ (CS) | $V_G$ (WL) Selected | $V_G$ (WL) Unselected | $V_D$ (BL) Selected | $V_D$ (BL) Un-selected | $V_{SUB}$ |
|---|---|---|---|---|---|---|
| Charge | −8 | +10 | 0 | High-Z (Floating) | | −8 |
| Read | 0 | +5 | 0 | +1 to +2 | 0 | 0 |
| Discharge | High-Z (Floating) | −8 | 0 | +5 | 0 | −0.01 to −4.5 |

As previously noted, in the conventional DINOR array configuration, a negative bias voltage $V_{SUB}$ is applied to P-well 550 (the effective substrate for array 504) during charging operations, and P-well 550 is grounded during discharge operations. In contradistinction, in accordance with the present invention, a negative bias is provided on P-well 550 of cell 510 during discharge operations. This significantly changes the operational characteristics of cells 510.

Applying a negative bias $V_{SUB}$ to P-well 550 during discharge enhances the rate of hot hole generation, thereby improving erase speed. Band-m-band tunneling current from source 512 to P-well 550 tends to be a function of the corner field $E_{CF}$ in channel 518 whereas F-N gate current tends to be a function of the vertical field $E_V$. As $V_{SUB}$ is increased to greater magnitude negative voltages, the horizontal field $E_H$ increases, thereby increasing the magnitude of corner field $E_{CF}$. This, in turn, increases the rate of hot hole generation due to impact ionization. This, in turn, tends to increase the band-to-band tunneling current. Ultimately, the increase in band-to-band tunneling current with the magnitude of the negative voltage $V_{SUB}$ on P-well 550 reaches a level at which the source/P-well junction breaks down, creating excessive avalanche current. However, intermediate values of $V_{SUB}$ provide substantial reductions in discharge time.

As in the case of cells 710, the discharge time of DINOR cells 510 is a function of the voltage difference between the P-well (effective substrate for the array) and the region (source or drain) where discharge is effected; a large voltage difference will effect a faster discharge. For example, referring to FIG. 10, cell 510 may be discharged at the drain by placing −9 volts on control gate 126, 4 volts on drain 514, and by floating source 512. With these biasing conditions, the time necessary to discharge cell 510 decreases as the magnitude of $V_{SUB}$ increases, as illustrated in FIG. 10 and summarized in Table IX below.

TABLE IX

| $V_G$ = −9 volts; $V_D$ = 4 volts; $V_S$ = floating | |
|---|---|
| $V_{SUB}$ (volts) | Discharge Speed ($V_T$ = 0) |
| 0 | 2 sec |
| −1 | 600 ms |
| −2 | 150 ms |
| −2.5 | 60 ms |
| −2.75 | 30 ms |
| −3 | 15 ms |
| −3.5 | 200 μs |

As with cell 710, faster discharge is effected, for a given value of $V_{SUB}$, by setting the discharge voltage of cell 710 equal to 5 volts during the discharge state (rather than 4 volts for FIG. 10 and Table IX). Exemplary values are shown in FIG. 11 and summarized in Table X below.

TABLE X

| $V_G$ = −9 volts; $V_D$ = 5 volts; $V_S$ = floating | |
|---|---|
| $V_{SUB}$ (volts) | Discharge Speed (microseconds) ($V_T$ = 0) |
| 0 | 100 ms |
| −1 | 30 ms |
| −1.5 | 15 ms |
| −1.75 | 9 ms |
| −2.0 | 2 ms |
| −2.25 | 200 μs |

As previously discussed, the effective discharge (programming) time per cell in a DINOR array is the discharge time divided by the number of cells in the row. Thus, if $V_{SUB}$ =0, as for prior art cell 510 (FIG. 3), the effective discharge rate is 100 ms / 512 bits ≈200 μs per bit. The discharge time of the DINOR cell in accordance with the present invention, however, is significantly improved (Table X). For $V_{SUB}$=−2 volts, the discharge time for the entire row is 9 ms. Thus, for $V_{SUB}$=−2 volts, the effective discharge speed per cell is 9 ms / 512 ≈18 μs per bit, more than an order of magnitude faster than the discharge time of cell 510 discharged using prior art methods.

Decreasing the discharge time by enhanced hot hole injection may, however, cause some undesirable side effects. For example, some of the hot holes may become trapped in gate dielectric layer 120, degrading the performance of the Memory device. In addition, an excess number of hot holes injected through gate dielectric layer 120 may cause physical degradation, reducing the endurance of the Memory device.

The value $V_{SUB}$ a may be varied in the negative range just below zero to any negative voltage that provides the desired discharge speed/performance characteristics. The optimal voltage for $V_{SUB}$ a to maximize discharge speed without significantly degrading performance over time may vary according to the physical characteristics of cell 510 (e.g. scale, doping, depth of diffused regions, etc.). Improved performance may be achieved by cell configurations designed to enhance speed and minimize degradation. Like cell 710, the corner field $E_{CF}$ of cell 510, may be optimized by junction engineering to achieve desired discharge speed and endurance characteristics for a predetermined level or range of $V_{SUB}$. For example, the size, doping level and doping profile of source region 512, drain region 514, and channel 518, and the material and thickness of tunnel dielectric 120 may be optimized to increase endurance according to particular levels of negative substrate bias $V_{SUB}$. Likewise, as with cell 710, a hot carrier resistant thin oxide such as nitrided oxide may be used for tunnel dielectric 120 in cell 510 to increase endurance.

The foregoing is a description of preferred exemplary embodiments and best mode of the invention known to the applicant at the time of filing the application. The invention is not limited to the specific forms shown. For example, modifications may be made in the design and arrangement of the elements within the scope of the invention, as expressed in the appended claims.

What is claimed is:

1. A floating gate memory device comprising:

an array of memory cells formed at least in part in a core semiconductor region of a predetermined conductivity type; and a control circuit for selectively charging, discharging and generating indicia of a charge state of each of the cells of the array;

each cell comprising
first and second semiconductor regions of a conductivity type opposite the conductivity type of the core region, a channel semiconductor region of the same conductivity type as the core region, and a selectively chargeable gate structure including a first dielectric overlying the channel region, a floating gate overlying the first dielectric and a control gate, the first, second and channel semiconductor regions being formed in the core region, with the first and second semiconductor regions defining a controlled current path through the channel region which tends to be rendered conductive in response to a voltage greater than a gate threshold level being applied to the control gate;

the gate threshold level being a function of the charge state of the floating gate, such that conduction of the cell in response to application to the control gate of a predetermined voltage is indicative of the logical state of the cell, and the cell being dischargeable by movement of electrons from the floating gate through the first dielectric to the first semiconductor region to remove the charge on the floating gate;

the control circuit composing a circuit for effecting selective discharge of the cell by, during discharge operations only, selectively applying a first predetermined positive voltage to the first semiconductor region, a high impedance to the second semiconductor region, a first predetermined negative voltage to the selectively chargeable gate structure, and a second predetermined negative voltage to the core semiconductor region;

whereby, during discharge operations only, hot holes are injected from the channel region through the first dielectric to the floating gate to increase the rate of discharge of the cell.

2. The memory device of claim 1 wherein the control circuit is adapted to receive an applied voltage from an external source, and comprises:

a first circuit, responsive to the applied voltage, for developing a predetermined relatively low magnitude positive voltage for selective application as the first predetermined positive voltage to the first semiconductor region during discharge operations only;

a second circuit, responsive to the applied voltage, for developing a relatively high magnitude negative voltage for selective application as the first predetermined negative voltage to the selectively chargeable gate structure during discharge operations only; and a third circuit, responsive to the applied voltage, for developing a predetermined relatively low magnitude negative voltage as the second predetermined negative voltage for application to the core semiconductor region during discharge operations only.

3. The memory device of claim 2 wherein the magnitude of the first predetermined negative voltage for application to the core semiconductor region during discharge operations is no higher than approximately −4.5 volts.

4. The memory device of claim 2 wherein the first predetermined negative voltage for application to the core semiconductor region is in the range of from approximately −1 to −3.5 volts.

5. The memory device of claim 2 wherein the first predetermined negative voltage for application to the core semiconductor region is in the range of from approximately −1 to −2.5.

6. The memory device of claim 2 wherein:

the first predetermined positive voltage for selective application to the first semiconductor region during discharge operations is in the range of from approximately +0.5 to +5 volts;

the first predetermined negative voltage for selective application to the gate structure during discharge operations is in the range of from approximately −13 to −7 volts; and the second predetermined negative voltage for selective application to the core semiconductor region during discharge operations is in the range of from approximately −0.01 to −4.5 volts.

7. The memory device of claim 1 wherein the control circuit is adapted to receive an applied voltage from an external source, and comprises:

a first charge pump, responsive to the applied voltage, for developing a relatively high magnitude second predetermined positive voltage for selective application to the gate structure during charge operations only;

a second charge pump, responsive to the applied voltage, for developing a relatively high magnitude third predetermined positive voltage, less than the magnitude of the second predetermined positive voltage, for selective application to the second semiconductor region during charge operations only;

regulator circuitry, responsive to the applied voltage, for developing an intermediate magnitude fourth predetermined positive voltage, and a relatively low magnitude fifth predetermined positive voltage for selective application to the gate structure and second semiconductor region respectively during read operations only and a relatively low magnitude sixth predetermined positive voltage for application to the first semiconductor region during discharge operations only;

a third charge pump, responsive to the applied voltage, for developing a relatively high magnitude third predetermined negative voltage for application to the gate structure during discharge operations only;

a fourth charge pump, responsive to the applied voltage, for developing a relatively low magnitude fourth predetermined negative voltage, for application to the core semiconductor region during discharge operations only.

8. The memory device of claim 7 wherein the intermediate magnitude fourth predetermined positive voltage is equal to the applied first predetermined positive voltage.

9. The memory device of claim 7 wherein:

the first predetermined positive voltage equals approximately +5 volts;

the second predetermined positive voltage for selective application to the gate structure during charge operations is in the range of from approximately +8 to +12 volts;

the third predetermined positive voltage, for selective application to the second semiconductor region during charge operations is in the range of from approximately +5 to +7 volts;

the fourth predetermined positive voltage for selective application to the gate structure during read operations is approximately 5 volts;

the fifth predetermined positive voltage for selective application to the second semiconductor region during read operations is in the range of from approximately +1 to +2 volts;

the sixth predetermined positive voltage for application to the first semiconductor region during discharge operations is in the range of from approximately +0.5 to +5 volts;

the third predetermined negative voltage for application to the gate structure during discharge operations is in the range of o from approximately −13 to −7 volts; and the fourth predetermined negative voltage for application to the core semiconductor region during discharge operations is in the range of from approximately −0.01 to −4.5 volts.

10. The memory device of claim 1 further comprising a p-type substrate, and a n-well formed in the p-type substrate, wherein the core semiconductor region comprises a p-well formed in the n-well.

11. The memory device of claim 10, wherein the control circuit is formed in a portion of the substrate electrically isolated from the p-well by the n-well.

12. The device of claim 1, wherein the array of cells is arranged in a series of rows and columns, with each row having an associated word line electrically connecting the gate structures of each of the cells within the row, each column having an associated bit line electrically connecting the second semiconductor regions of each of the cells within the column, and the first semiconductor region of each cell within the array electrically connected by a common line.

13. The device of claim 1, wherein:

the first semiconductor regions of each cell in the array is electrically connected in common;

the array is divided into respective banks of cells;

each bank of cells is arranged in a series of rows and columns, with each row having an associated word line electrically connecting the gate structures of each of the cells within the row, each column having an associated selection device and sub-bit line electrically connecting the second semiconductor regions of each of the cells within the column;

the word lines of the corresponding rows of the respective banks of cells are electrically connected; and the sub-bit lines of the corresponding columns of the respective banks of cells are selectively electrically connected in the alternative to a respective bit line in accordance with the state of the associated selection devices.

14. The memory device of claim 13, wherein the control circuit is adapted to receive an applied first predetermined positive voltage from an external source, and comprises circuitry for developing:

a relatively high magnitude second predetermined positive voltage for application to the gate structure during charge operations;

a relatively high magnitude first predetermined negative voltage, for application to the first semiconductor region during charge operations;

a relatively high magnitude second predetermined negative voltage, for application to the core semiconductor region during charge operations;

an intermediate magnitude third predetermined positive voltage for selective application to the gate structure during read operations;

a relatively low magnitude fourth predetermined positive voltage for selective application to the second semiconductor region during read operations;

a relatively high magnitude third predetermined negative voltage for selective application to the gate structure during discharge operations;

an intermediate magnitude fifth predetermined positive voltage for selective application to the second semiconductor region during discharge operations; and a relatively low magnitude fourth predetermined negative voltage, for application to the core semiconductor region during discharge operations.

15. The memory device of claim 14, wherein the third predetermined positive voltage and the fifth predetermined positive voltage are equal to the applied first predetermined positive voltage.

16. The memory device of claim 14, wherein:

the first predetermined negative voltage, for application to the first semiconductor region during charge operations is approximately equal to the second predetermined negative voltage, for application to the core semiconductor region during charge operations.

17. The memory device of claim 14, wherein:

the applied first predetermined positive voltage from an external source is approximately +5 volts;

the second predetermined positive voltage for application to the gate structure during charge operations is in the range of approximately −10 volts;

the first predetermined negative voltage, for application to the first semiconductor region during charge operations is approximately −8 volts;

the second predetermined negative voltage, for application to the core semiconductor region during charge operations is approximately −8 volts;

the third predetermined positive voltage for selective application to the gate structure during read operations is approximately +5 volts;

the fourth predetermined positive voltage for selective application to the second semiconductor region during read operations is in the range of approximately +1 to +2 volts;

the third predetermined negative voltage for selective application to the gate structure during discharge operations is t approximately −8 volts the fifth predetermined intermediate magnitude positive voltage for selective application to the second semiconductor region during discharge operations is approximately +5 volts; and the fourth predetermined negative voltage, for application to the core semiconductor region during discharge operations is in the range of approximately −0.01 to −4.5 volts.

18. The device of claim 1, wherein:

the array of cells is arranged in a predetermined number of equal-sized sectors, with the first semiconductor regions of each cell in each sector electrically connected in common, but isolated from the first semiconductor regions of the cells of the other sectors;

each sector is divided into respective banks of cells;

each bank of cells is arranged in a series of rows and columns, with each row having an associated word line electrically connecting the gate structures of each of the cells within the row, each column having an associated selection device and sub-bit line electrically connecting the second semiconductor regions of each of the cells within the column;

the word lines of the corresponding rows of the respective banks of cells within the sector are electrically connected; and the sub-bit lines of the corresponding columns of the respective banks of cells within the sector are selectively electrically connected in the alternative to a respective bit line in accordance with the state of the associated selection devices.

19. The memory device of claim 14 wherein the selectively chargeable gate structure comprises:

said first dielectric disposed above the channel region;

a conductive floating gate disposed on the first dielectric;

a second dielectric layer disposed on the floating gate; and a conductive control gate disposed on the second dielectric layer.

20. The memory device of claim 1 wherein the first dielectric comprises a layer of silicon dioxide.

21. The memory device of claim 1 wherein the first dielectric comprises a layer of hot carrier resistant oxide.

22. The memory device of claim 21 wherein the first dielectric comprises a layer of nitrided oxide.

23. The memory device of claim 19 wherein the first dielectric layer has a thickness from 50 to 200 angstroms.

24. The memory device of claim 19 wherein the first dielectric layer has a thickness from 50 to 150 angstroms.

25. The memory device of claim 19 wherein the first dielectric layer has a thickness from 70 to 150 angstroms.

26. The memory device of claim 19 wherein the first dielectric layer has a thickness from 80 to 120 angstroms.

27. The memory device of claim 19 wherein the first dielectric layer and the floating gate are also disposed above a portion of the first semiconductor region.

28. The memory device of claim 19 wherein the first dielectric layer and the floating gate are also disposed above a portion of the second semiconductor region.

\* \* \* \* \*

UNITED STATES PATENT AND TRADEMARK OFFICE
CERTIFICATE OF CORRECTION

PATENT NO. : 5,617,357

DATED : April 1, 1997

INVENTOR(S) : Sameer S. Haddad, et al.

It is certified that error appears in the above-indentified patent and that said Letters Patent is hereby corrected as shown below:

Column 2, line 22, "Fahrenheit" should read --Fahrenheit)--.

Column 3, line 10, "$V_g$" should read --$V_G$--.

Column 3, line 13, "$V_g$" should read --$V_G$-- and "V" should read --$V_{T1}$--.

Column 4, line 11, "$V_{cc}$" should read --$V_{CC}$--.

Column 4, line 12, "$V_{cc}$" should read --$V_{CC}$--.

Column 4, line 16, "$V_{cc}$" should read --$V_{CC}$--.

Column 4, line 36, "DIvided bit-line NOR"
   should read --DIvided bit-line NOR--.

Column 5, line 17, "5 13" should read --513--.

Column 6, line 61, "$V_s$" should read --$V_S$--.

Column 6, line 65, "$V_s$" should read --$V_S$--.

Column 8, line 26, "$V_{cc}$" should read --$V_{CC}$--.

Column 8, line 34, "$V_{cc}$" should read --$V_{CC}$--.

Column 9, line 20, "$E_v$" should read --$E_V$--.

Column 9, line 22, "turn" should read --turn,--.

Column 11, line 47, "Band-m-band" should read --Band-to-band--.

Column 11, line 48, "comer" should read --corner--.

Column 13, line 3, "$V_{SUB}$ a may" should read --$V_{SUB}$ may--.

Column 13, line 6, "$V_{SUB}$ a to" should read --$V_{SUB}$ to--.

Column 15, line 44, "of o from" should read --of from--.

Column 16, line 61, "-10" should read --+10--.

UNITED STATES PATENT AND TRADEMARK OFFICE
CERTIFICATE OF CORRECTION

PATENT NO. : 5,617,357
DATED : April 1, 1997
INVENTOR(S) : Sameer S. Haddad, et al.

It is certified that error appears in the above-indentified patent and that said Letters Patent is hereby corrected as shown below:

Column 17, line 10, "is t approximately" should read --is approximately--.

Signed and Sealed this

Fifteenth Day of July, 1997

Attest:

BRUCE LEHMAN

Attesting Officer    Commissioner of Patents and Trademarks